(12) United States Patent
Casarsa

(10) Patent No.: US 7,246,288 B2
(45) Date of Patent: Jul. 17, 2007

(54) INTEGRATED DEVICE WITH AN IMPROVED BIST CIRCUIT FOR EXECUTING A STRUCTURED TEST

(75) Inventor: Marco Casarsa, Vaprio D'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 348 days.

(21) Appl. No.: 10/876,372

(22) Filed: Jun. 24, 2004

(65) Prior Publication Data
US 2005/0034041 A1 Feb. 10, 2005

(30) Foreign Application Priority Data
Jun. 24, 2003 (EP) ................. 03425405

(51) Int. Cl.
*G01R 31/28* (2006.01)
(52) U.S. Cl. ...................... 714/733; 714/738
(58) Field of Classification Search .......... 708/254; 714/728, 739, 727, 24, 30, 124, 738, 733
See application file for complete search history.

(56) References Cited

U.S. PATENT DOCUMENTS

| | | | |
|---|---|---|---|
| 4,701,920 A | 10/1987 | Resnick et al. ............... 371/25 |
| 5,138,619 A | 8/1992 | Fasang et al. ............. 371/21.1 |
| 5,383,143 A * | 1/1995 | Crouch et al. ............... 708/254 |
| 5,471,482 A * | 11/1995 | Byers et al. ............... 714/719 |
| 5,570,035 A | 10/1996 | Dukes et al. ............... 324/763 |
| 5,574,733 A * | 11/1996 | Kim .......................... 714/728 |
| 5,872,793 A | 2/1999 | Attaway et al. ......... 371/22.31 |
| 6,119,250 A | 9/2000 | Nishimura et al. ......... 714/718 |
| 6,208,477 B1 | 3/2001 | Cloke et al. ................. 360/31 |
| 6,272,653 B1 | 8/2001 | Amstutz ..................... 714/724 |
| 6,311,300 B1 | 10/2001 | Omura et al. ............... 714/724 |
| 6,456,101 B2 | 9/2002 | Dumbri ..................... 324/763 |
| 6,684,358 B1 * | 1/2004 | Rajski et al. ............... 714/739 |
| 6,701,476 B2 * | 3/2004 | Pouya et al. ................ 714/727 |
| 6,757,857 B2 * | 6/2004 | Lamb et al. ................ 714/740 |
| 6,760,873 B1 * | 7/2004 | Hao et al. ................... 714/724 |

(Continued)

FOREIGN PATENT DOCUMENTS

EP 0 838 760 A2 4/1998

OTHER PUBLICATIONS

Bushnell, M. et al., *Essentials of Electronic Testing for Digital, Memory and Mixed-Signal VLSI Circuits*, Kluwer Academic Publishers, 2000, Chapters 18.5-18.8, pp. 606-611.

(Continued)

*Primary Examiner*—David Ton
(74) *Attorney, Agent, or Firm*—Lisa K. Jorgenson; Ronald Stern; Seed IP Law Group PLLC

(57) ABSTRACT

An integrated device including a functional circuitry and a built-in self testing circuit for executing a structured test on the functional circuitry is proposed. The functional circuitry includes means for receiving input test values from the built-in self testing circuit and returning output test values to the built-in self testing circuit. In the solution of the invention, the built-in self testing circuit includes a memory for storing starting test values and expected test values, means for generating the input test values according to the starting test values, and means for determining a result of the structured test according to a comparison between the output test values and the expected test values.

15 Claims, 3 Drawing Sheets

U.S. PATENT DOCUMENTS

| | | | |
|---|---|---|---|
| 6,829,728 B2* | 12/2004 | Cheng et al. | 714/30 |
| 6,928,638 B2* | 8/2005 | Parvathala et al. | 717/124 |
| 6,934,900 B1* | 8/2005 | Cheng et al. | 714/738 |
| 7,093,175 B2* | 8/2006 | Rajski et al. | 714/728 |
| 2001/0054166 A1 | 12/2001 | Fukuda | 714/733 |
| 2002/0070746 A1 | 6/2002 | Sugiura et al. | 324/765 |

OTHER PUBLICATIONS

Setty, A. et al., "BIST and Interconnect Testing with Boundary Scan," in *Proceedings of the Southeast Conference*, Williamsburg, Apr. 7-10, 1991, pp. 12-15.

* cited by examiner

INTEGRATED DEVICE WITH AN IMPROVED BIST CIRCUIT FOR EXECUTING A STRUCTURED TEST

BACKGROUND OF THE INVENTION

1. Field of the Invention

The present invention relates to an integrated device with a Built-in Self Testing (BIST) circuit for executing a structured test.

2. Description of the Related Art

The structured test is a technique that has become increasingly popular in the last years, especially for testing complex integrated circuits. For this purpose, the integrated device is provided with internal structures permitting the controllability and the observability of each pin and/or internal sequential element (referred to as a node).

A known and commonly used technique for executing the structured test is the scan method. In this method, the integrated device is provided with boundary scan cells (for the pins) and/or internal scan cells (for the internal nodes). The boundary scan cells are serially connected in a chain and the internal scan cells are serially connected in one or more chains (between corresponding input pins and output pins of the integrated device). Input patterns (commonly referred to as input test vectors) are serially loaded along the chains of scan cells for exciting the pins and the internal nodes of the integrated device. The values generated in response to the input test vectors (commonly referred to as output test vectors) are captured by the corresponding scan cells and then provided to the outside by shifting them along the chains. The output test vectors can then be compared with expected test data, representing the correct known output test vectors. The above-described architecture makes it possible to execute the structured test with a very low impact on the integrated device.

In a different architecture, disclosed in document U.S. Pat. No. 5,872,793, the integrated device is provided with a pseudo-random pattern generator for supplying the input test vectors in response to starting test vectors (commonly referred to as seeds), which are received from the outside.

The main disadvantage of the solutions known in the art is the use of external test equipment for applying the input test vectors or the seeds to the integrated device and for comparing the output test vectors with the expected test data. Furthermore, it is necessary to carefully synchronize the external test equipment with a system clock of the integrated device for detecting transition faults in the functional circuitry; therefore, when the frequency of operation of the integrated device is high, the external test equipment becomes very expensive.

BIST circuits for executing the structured test have also been proposed. The BIST circuit is essentially the implementation of logic built into the integrated device to do testing. The BIST circuit is triggered by an external signal, and it returns a value indicating the passing or the failing of the test. This structure allows testing the integrated device both before and after assembly into a complex system (such as a computer). In the BIST circuits known in the art for executing the structured test, the input test vectors are generated inside the integrated device from a hardwired starting value. However, this structure provides poor performance in terms of fault coverage.

The possibility to implement a reliable and fast BIST circuit for executing the structured test on the integrated devices would be desirable. Particularly, this need is perceived when the integrated devices must be assembled in safety systems (such as AIRBAGs and ABSs in automotive devices), which need to be tested during all their life time without the use of external test equipments.

BRIEF SUMMARY OF THE INVENTION

It is an object of the present invention to overcome the above-mentioned drawbacks. In order to achieve this object, an integrated device as set out in the following first claims is proposed.

Briefly, the present invention provides an integrated device including a functional circuitry and a built-in self testing circuit for executing a structured test on the functional circuitry, the functional circuitry including means for receiving input test values from the built-in self testing circuit and returning output test values to the built-in self testing circuit, wherein the built-in self testing circuit includes a memory for storing starting test values and expected test values, means for generating the input test values according to the starting test values, and means for determining a result of the structured test according to a comparison between the output test values and the expected test values.

Moreover, a corresponding method of executing a structured test on a functional circuitry of an integrated device is also encompassed.

BRIEF DESCRIPTION OF THE SEVERAL VIEWS OF THE DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
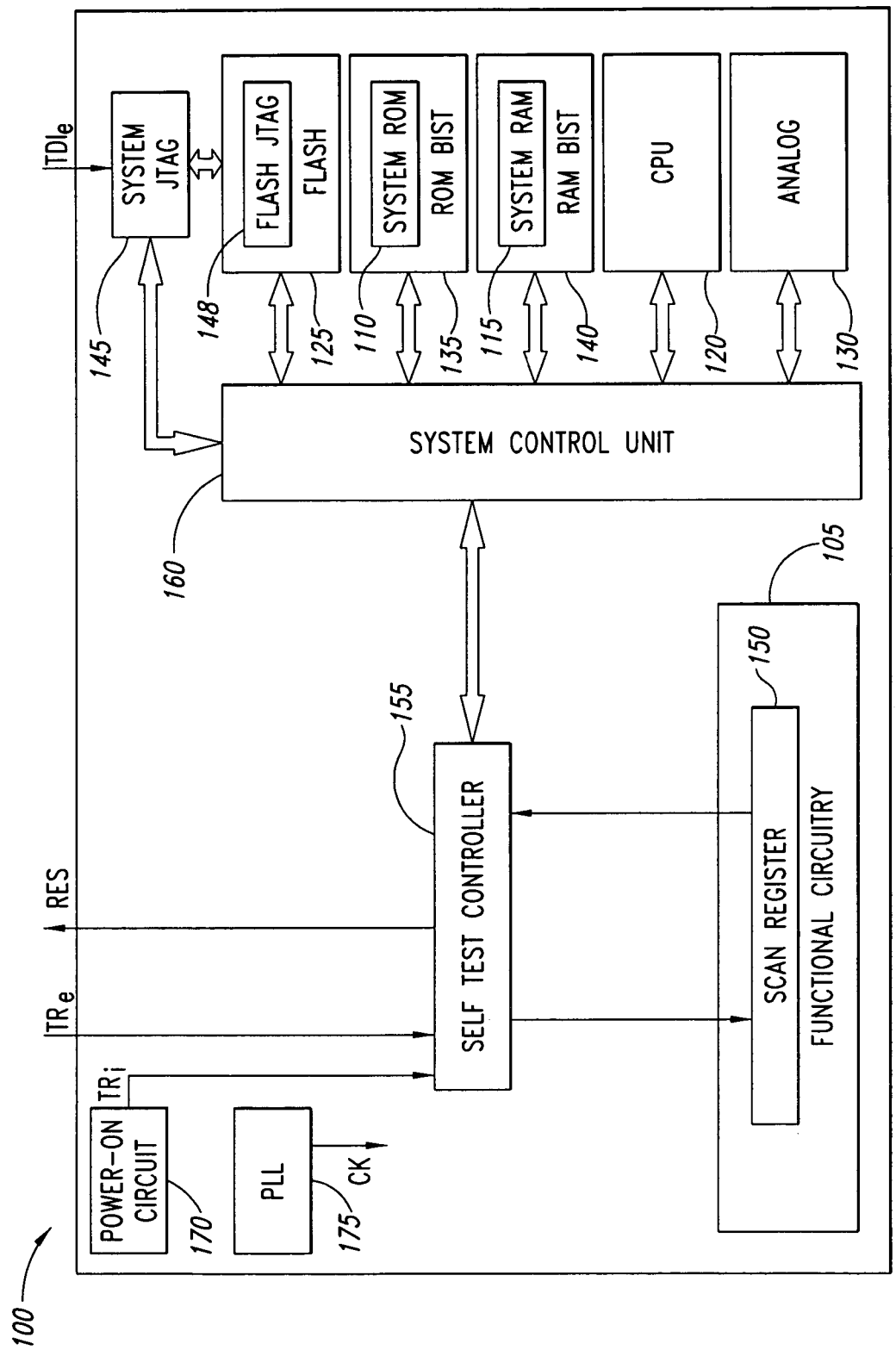
FIG. 1 is a schematic block diagram of an integrated device in which the solution of the invention is applicable.

With reference in particular to FIG. 1, a schematic block diagram of an integrated device 100, in which the solution of the invention is applicable, is shown. For example, the integrated device 100 consists of a System on Chip; particularly, the integrated device 100 includes a functional circuitry 105, a system ROM memory 110, a system RAM memory 115, a CPU 120 (i.e., a central processing unit), a system flash memory 125 and an analog circuitry 130.

The system ROM memory 110 and the system RAM memory 115 are included in a system ROM BIST circuit 135 and in a system RAM BIST circuit 140, respectively. A test on the system ROM and RAM memories 110, 115 and on the system flash memory 125 is allowed by a JTAG interface 145, compatible with the IEEE standard 1149.1; the JTAG interface 145 receives an external test signal $TDI_e$, and is coupled with a corresponding interface 148 of the system flash memory 125.

A self test controller 155 is embedded in the integrated device 100. The self test controller 155 is coupled with the functional circuitry 105. For this purpose, the scan logic architecture is implemented in the functional circuitry 105, so that a scan method for testing can be applied. In detail, the functional circuitry 105 includes boundary and/or internal scan cells. The boundary scan cells are associated with corresponding pins of the functional circuitry 105 and consist of one or more additional flip-flops. On the other hand the internal scan cells are implemented by using already existing flip-flops, each one defining an internal node of the functional circuitry 105. The boundary and internal scan cells are serially connected to form one or more shift registers, denoted as a whole as scan register 150; the scan register 150 permits to stimulate every pin and every internal node and to detect the response of the functional circuitry 105. The self test controller 155 provides the input test vectors to the functional circuitry 105 and samples the output test vectors generated by the functional circuitry 105. The boundary scan cells also permit isolating the functional circuitry 105 from the surrounding circuit elements while the internal self-test is performed.

The self test controller 155 communicates with a system control unit 160, which manages the tests on the system ROM and RAM memories 110, 115 and on the system flash memory 125, through the JTAG interface 145, and which supplies indications of the results of these tests to the self test controller 155. The self test controller 155 is also able to manage the system ROM and RAM BIST circuits 135, 140 (and a possible BIST circuit on the CPU 120) directly by providing an auxiliary trigger signal to them and by receiving an indication of the result of the corresponding tests.

The structured test is executed on the functional circuitry 105 when an internal trigger signal $TR_i$ is provided to the self test controller 155 by a circuit 170 detecting a power-on of the integrated device 100 or when an external trigger signal $TR_e$ is provided to the self test controller 155 by external sources.

The self test controller 155 externally returns an output sequence of values RES in response to the result of the tests executed on the integrated device 100.

A phase locked loop (PLL) circuit 175 is included in the integrated device 100 for providing a system clock signal CK. The system clock signal CK synchronizes all the components of the integrated device 100, and in particular, the functional circuitry 105 and the self test controller 155.

Of course, the concepts of the present invention are also applicable when the integrated device has another structure or when the functional circuitry is implemented by a different architecture, which permits a structured test. Similar considerations apply if the system control unit is not implemented on the integrated device or if further units communicate with the self test controller. Alternatively, the system clock signal can be generated by a circuit different from the PLL.

Figure 2:
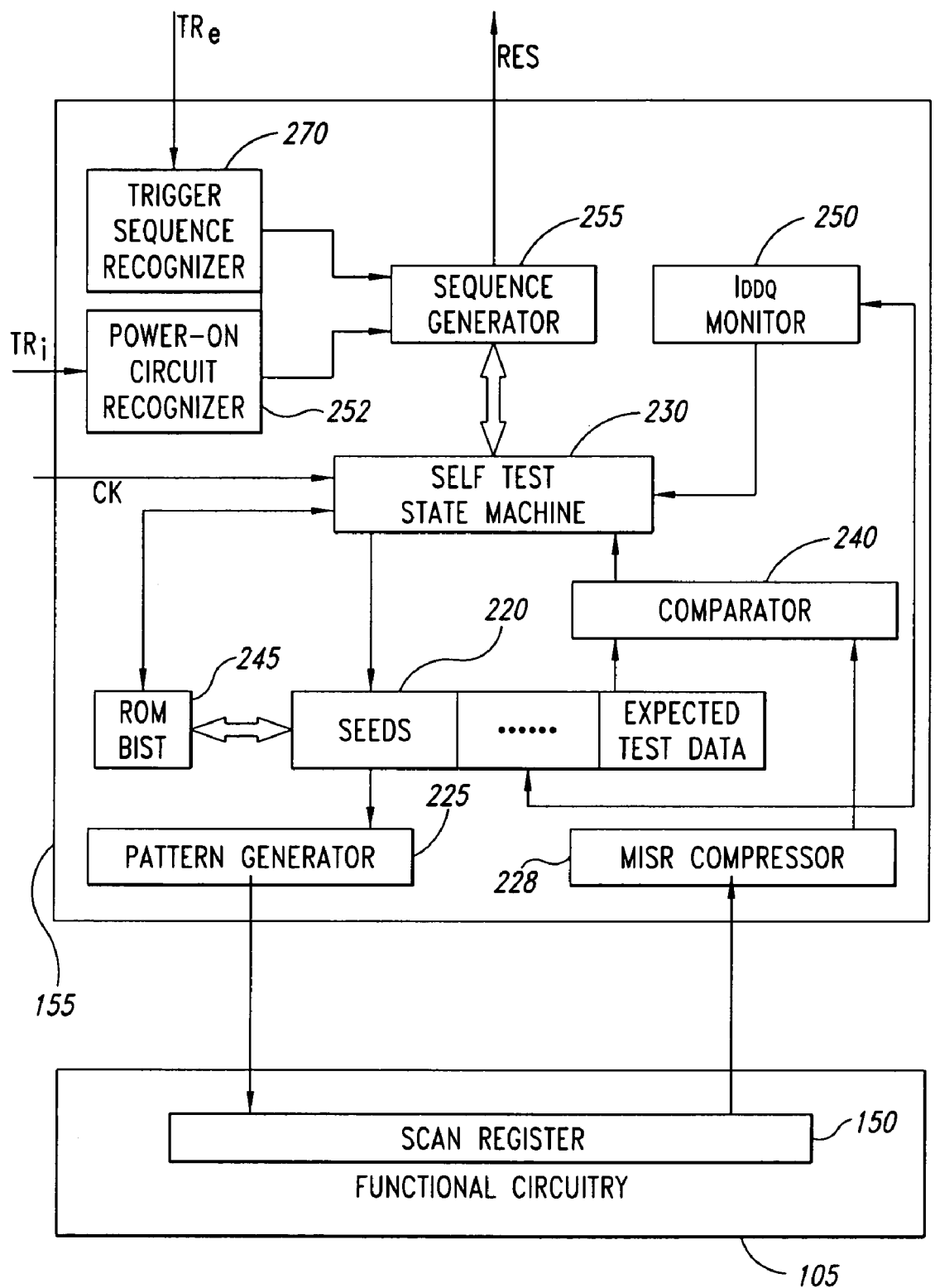
FIG. 2 is a detailed block diagram of an embodiment of the circuit for testing a functional circuitry of the integrated device according to the present invention.

Referring to FIG. 2, a detailed block diagram of the self test controller 155 is shown (the elements corresponding to the ones in FIG. 1 are denoted with the same references, and their explanation is omitted for the sake of simplicity).

The self test controller 155 includes a ROM memory 220 for storing the seeds necessary to generate the input test vectors, and the expected test data necessary to verify the result of the structured test. The ROM memory 220 further includes instructions for controlling the operations to be executed during the tests on the functional circuitry 105; for example, the ROM memory 220 can define the number of input test vectors to be applied.

A pattern generator 225 receives a seed at the time from the ROM memory 220 and supplies the corresponding input test vectors to the functional circuitry 105. The pattern generator 225 is a particular type of linear feedback shift register (LFSR), in which the seed provided by the ROM memory 220 determines the patterns to be generated. The pattern generator 225 cycles through different states, providing different input test vectors, without repeating a single state twice. The input test vector, generated in a particular state, is pseudo-random and has a low correlation with the input test vectors generated in any other state in time.

For reducing the size of the area occupied by the expected test data in the ROM memory 220, the self test controller 155 is provided with a MISR (multiple input signature register) compressor 228, which is a variant of the above-described LFSR. The MISR compressor 228 applies an algorithm, which compresses the serially received output test vectors into a unique so-called signature. It is useful to translate the output test vectors, sampled from the functional circuitry 105, in a corresponding test signature, so that the expected test data, stored in the ROM memory 220, will be only signatures of the correct known output test vectors. The MISR compressor 228 can generate multiple test signatures from corresponding sequences of a predefined number of output test vectors or a single test signature from the sequence of all the output test vectors.

An indication of the result of the structured test is provided to a self test state machine 230 by a comparator 240, which compares the test signature(s) returned by the MISR compressor 228 and the expected test data received from the ROM memory 220.

The self test controller 155 further includes a ROM BIST circuit 245, which executes a test on the ROM memory 220. The self test state machine 230 actuates the ROM BIST circuit 245 before the execution of the structured test. An indication of the result of the test on the ROM memory 220 is returned to the self test state machine 230.

An $I_{DDQ}$ monitor 250 is further integrated in the self test controller 155 and detects one or more quiescent currents in the integrated device (i.e. the currents of the integrated device when disabled). For example, when the analog circuitry consists of a plurality of blocks, the $I_{DDQ}$ monitor 250 detects the quiescent current of one block at the time, while the other blocks are put in a power-down condition, the condition reached when any biasing circuits of the block are disabled.

The $I_{DDQ}$ monitor 250 can also use the scan method for applying current test vectors generated by the pattern generator 225 from corresponding seeds stored in the ROM memory 220 to select the functional circuitry 105, or desired blocks thereof for detecting the respective quiescent currents. Each quiescent current so measured is compared with a corresponding threshold value, stored in the ROM memory 220, so that a possible leakage can be localized in a determined block.

An indication of the comparison between the values of the quiescent currents and the value of the threshold currents is provided to the self test state machine 230.

When the internal trigger signal $TR_i$ is asserted, a power-on circuit recognizer 252 supplies a start signal to a sequence generator 255, which outputs a corresponding start sequence for initializing the self test state machine 230.

When the external trigger signal $TR_e$ is asserted, a trigger sequence recognizer 270 supplies a corresponding further start signal to the sequence generator 255. The sequence generator 255 will output a different start sequence, indicative of the operations that the self test controller 155 has to execute, and will provide it to the self test state machine 230.

As a further enhancement the self test controller could be provided with an interface compatible with the IEEE standard 1149.1.

Alternatively, the memory integrated in the self test controller is of a different type, such as of the flash type or more generally of a non-volatile type, and also the pattern generator and/or the compressor are implemented by a different structure.

Figure 3:
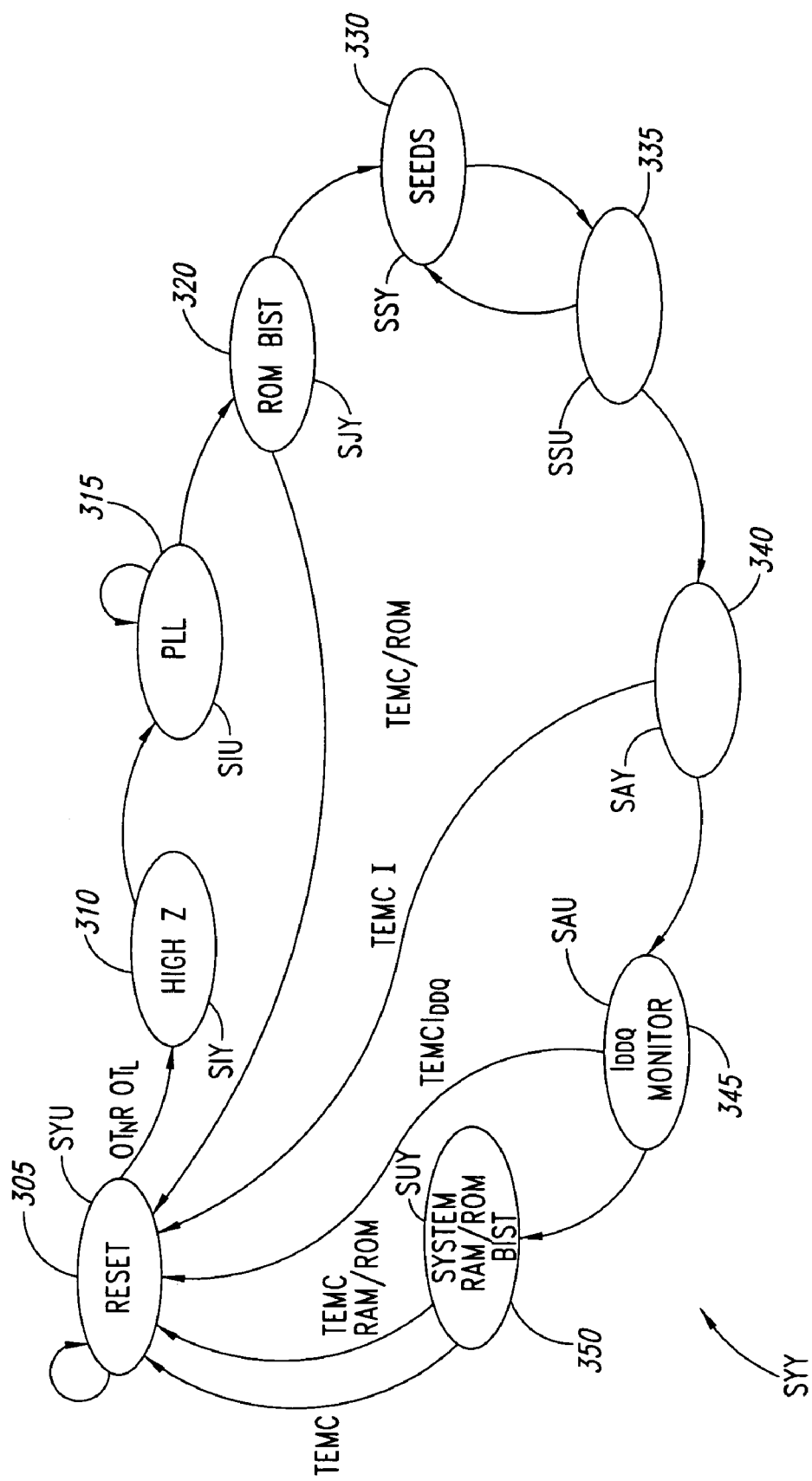
FIG. 3 shows an exemplary state diagram for a state machine used in the testing circuit.

Considering now FIG. 3, an exemplary state diagram 300 for the self test state machine described above is shown. The self test state machine waits in a reset state 305 until the sequence generator provides the start sequence in response to the assertion of the internal trigger signal $TR_i$ or of the external trigger signal $TR_e$. Then the input/output (i.e., bi-directional) pins of the functional circuitry are put into a high-impedance condition in a state 310 to avoid external interactions.

The self test state machine, in a state 315, waits for the PLL circuit to lock to a nominal frequency of operation of the functional circuitry (so that transition faults can be detected by performing at-speed test) and after, in a state 320, actuates the ROM BIST on the ROM memory. If the ROM BIST fails, the output sequence RES, indicative of the failure of the ROM BIST, is returned to the outside of the integrated device and the self test state machine goes back to the reset state 305. Otherwise, the structured test is actuated and, in a state 330, the pattern generator accesses the seeds stored in the ROM memory and generates the input test vectors accordingly.

In a state 335 the input test vectors are serially supplied to the scan register; concurrently, the output test vectors are serially returned through the scan register to the self test controller and compressed by the MISR compressor. It should be noted that the MISR compressor, by starting the compression in the first cycle of the clock signal corresponding to the actuation of the structured test, compresses also no-significant vectors, which are then discarded. From the state 335 the self test state machine reaches again the state 330 and cycles in a loop 330, 335 until all the seeds in the ROM memory have been processed. Finally, in a state 340, the test signature is compared with the expected test data stored in the ROM memory.

From the result provided by the comparator, the self test state machine determines a result of the structured test. If the structured test fails, the self test state machine returns the output sequence RES indicative of the fault occurred during the structured test and goes back to the reset state 305.

If the structured test is successful the $I_{DDQ}$ monitor detects the quiescent currents of the integrated device (state 345). Particularly, when the block under test is different than the analog circuitry, the whole analog circuitry is forced into the power-down condition, because it generates static power consumptions that can invalidate the test (if the power supply of each block is not separated). When the values of the quiescent currents are greater than the values of the threshold currents stored in the ROM memory, the output sequence RES indicates the presence of leakage in the integrated device and the self test state machine reaches the reset state 305.

If the test executed by the $I_{DDQ}$ monitor is successful, the self test state machine, in a state 350, actuates the system RAM and ROM BIST and waits for the corresponding results. When the system RAM and/or ROM memories are damaged, the self test state machine provides a corresponding output sequence RES and returns to the reset state 305. Conversely, the output sequence RES provides a pass sequence indicating that the tests on the integrated device are successful; the self test state machine then reaches the reset state 305 and permits the normal operation of the integrated device.

The sequence generator externally returns the output sequence RES, which implements a code indicative of the failure of the test on the ROM memory, of the structured test, of the detections of the $I_{DDQ}$ monitor or of the system ROM and RAM BIST, or which implements the pass sequence. Therefore it is possible to determine if the failure is due to the ROM memory, to the functional circuitry, to leakages in the integrated device, or to defects in the system RAM and ROM memories.

It will be appreciated that the state diagram described above is merely exemplary, and other state transition schemes may be implemented in the BIST architecture according to the present invention. For example, when the test fails because of an error in the ROM memory, new input test vectors and/or expected test data can be loaded from the outside (by-passing the ROM memory); in this way it is possible to localize where the fault occurred by executing an off-line diagnose (a diagnose when the integrated device is not operating). Alternatively, the $I_{DDQ}$ monitor selects the blocks of the integrated device in a different way, or the blocks different from the selected one are forced into the power-down condition disconnecting them from a power supply.

More generally, the present invention proposes an integrated device including a functional circuitry and a built-in self testing circuit for executing a structured test on the functional circuitry. The functional circuitry includes means for receiving input test values from the built-in self testing circuit and returning output test values to the built-in self testing circuit. In the integrated device of the invention the built-in self testing circuit includes a memory for storing starting test values and expected test values. Means are provided for generating the input test values according to the starting test values. The integrated device also includes means for determining a result of the structured test according to a comparison between the output test values and the expected test values.

The proposed structure makes it possible to avoid the use of an external test equipment to apply the input test values or the starting test values to the functional circuitry. Since the results of the tests on the proposed integrated device are processed by the built-in self testing circuit, the number of tasks, which must be performed by external components, is greatly reduced, and their maintenance software is extremely simplified, or even eliminated. As a consequence, the cost of the external components is substantially reduced. The above-mentioned advantages are clearly perceived when the integrated device works at a high nominal frequency (even if other applications are not excluded). In the proposed integrated device the structured test can be executed during all the life time of the integrated device, thereby increasing its reliability.

An important observation is that the size of the memory, used by the built-in self testing circuit, is greatly reduced by storing only the starting test values to be supplied to the means for generating the input test values, rather than storing directly the input test values. Nevertheless, this result is achieved without adversely affecting the quality of the structured test.

The preferred embodiment of the invention described above offers further advantages.

Particularly, the self test controller includes the sequence generator for providing the output sequence indicative of the result of the structured test outside the integrated device.

In this way it is possible also to know which type of fault occurs in the integrated device. Alternatively, the output sequence is not externally returned and the self test state machine aborts the normal operation of the integrated device when the test fails.

The concepts of the present invention are preferably applicable if the functional circuitry includes one or more scan registers.

The scan register permits the observability and the controllability of the pins and of the internal nodes of the device under test.

However, the solution according to the present invention is also suitable to be implemented with different architectures, which permit to execute the structured test.

The self test controller includes the MISR compressor for generating one or more test signatures, in response to corresponding sequences of the output test vectors, and the comparator for comparing the test signature(s) with the expected test data.

Consequently, it is possible to further reduce the size of the area occupied in the ROM memory by compressing the expected test data as well.

However, the MISR compressor is not necessary (for example, if the memory depth is not excessive) and the output test vectors can be compared on-the-fly with the expected test data. In this case, it is also possible to localize the cause of the faults (for example, downloading the output test vectors and an indication of the cycle in which the fault occurred).

As a further enhancement, the self test controller includes the ROM BIST circuit to execute the test on the ROM memory; the structured test is executed in response to the result of the test on the ROM memory.

Consequently, the reliability of the structured test is substantially increased; in any case the ROM BIST circuit can also be not implemented.

Advantageously, the $I_{DDQ}$ monitor is integrated in the self test controller to detect one or more quiescent currents of the integrated device. This feature further improves the coverage of the test performed on the integrated device.

When the integrated device includes a plurality of blocks, the $I_{DDQ}$ monitor can detect the quiescent currents of each block and compare the values of the quiescent currents with the values of the corresponding threshold currents while the other blocks are disabled.

This structure of the $I_{DDQ}$ monitor permits to detect the quiescent currents without the influence of the static power consumption of the blocks not included in the test, and to compare the detected currents with the threshold currents corresponding to each block.

Alternatively, a single value of the threshold current is stored, the quiescent current of the whole integrated device is tested, the $I_{DDQ}$ monitor is external to the integrated device and actuated by a start signal provided by the self test controller, or no $I_{DDQ}$ monitor is provided.

A way to further improve the solution is to make the output sequence also indicative of the results of the test on the ROM memory and/or of the test on the quiescent currents.

More information about the results of the tests permits to analyze the causes of any possible failure and also to decide if the operation of the integrated device must be aborted.

Alternatively, the output sequence RES can provide different information or consists of a single bit simply indicating whether the test has passed or failed.

Preferably, the integrated device includes the power-on circuit for actuating the self test controller in response to the power-on of the integrated device.

In this way the integrated device can actuate the self test controller without the use of any external device. Alternatively, the power-on circuit can also be not connected to the self test controller, or the self test controller only waits for the external trigger signal or the internal trigger signal.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Naturally, in order to satisfy local and specific requirements, a person skilled in the art may apply to the solution described above many modifications and alterations all of which, however, are included within the scope of protection of the invention as defined by the following claims.

The invention claimed is:

1. An integrated device comprising:
a functional circuitry and a built-in self testing circuit for executing a structured test on the functional circuitry, the functional circuitry including means for receiving input test values from the built-in self testing circuit and returning output test values to the built-in self testing circuit,
the built-in self testing circuit including a memory for storing starting test values and expected test values, means for generating the input test values according to the starting test values, and means for determining a result of the structured test according to a comparison between the output test values and the expected test values.

2. The integrated device according to claim 1 wherein the built-in self testing circuit further includes means for providing an error code indicative of the result of the structured test outside the integrated device.

3. The integrated device according to claim 1 wherein the means for receiving input test values from the built-in self testing circuit and returning output test values to the built-in self testing circuit includes a plurality of cells, the cells being serially connected for implementing at least one scan register.

4. The integrated device according to claim 1 wherein the means for determining the result of the structured test includes means for generating at least one compressed value in response to corresponding sequences of the output test values, and means for comparing the at least one compressed value with the expected test values.

5. The integrated device according to claim 1 wherein the built-in self testing circuit further includes means for executing a memory test on the memory, the structured test being executed in response to a result of the memory test.

6. The integrated device according to claim 5 wherein the error code is further indicative of the result of the memory test and/or of the quiescent test.

7. The integrated device according to claim 1 wherein the built-in self testing circuit further includes means for executing a quiescent test by comparing at least one quiescent current of the integrated device with at least one threshold value stored in the memory.

8. The integrated device according to claim 7 wherein the integrated device includes a plurality of blocks and the at least one threshold value consists of a plurality of threshold values each one for a corresponding block, the means for executing the quiescent test including means for selecting one of the blocks, means for disabling the blocks different from the selected block, and means for comparing the quiescent current of the selected block with the corresponding threshold value.

9. The integrated device according to claim 1 wherein the integrated device further includes means for actuating the built-in self testing circuit in response to a power-on of the integrated device.

10. A method of executing a structured test on functional circuitry of an integrated device, the method including the steps of:
    receiving input test values at the functional circuitry from a built-in self testing circuit of the integrated device;
    returning output test values from the functional circuitry to the built-in self testing circuit;
    generating the input test values according to starting test values stored in a memory of the integrated device;
    performing a comparison between the output test values and expected test values; and
    determining a result of the structured test according to the comparison between the output test values and the expected test values stored in the memory.

11. An integrated device comprising:
    a functional circuitry positioned on the integrated device;
    a built-in self testing circuit positioned on the integrated device and operable to execute a structured test on the functional circuitry, the functional circuitry having a scan register to receive input test values from the built-in self testing circuit and return output test values to the built-in self testing circuit, the built-in self testing circuit having a memory sized to store starting test values and expected test values, and a pattern generator operable to generate the input test values according to the starting test values; and
    a self test state machine operable to determine a result of the structured test according to a comparison between the output test values and the expected test values.

12. The integrated device according to claim 11 wherein the scan register includes a plurality of serially connected cells.

13. The integrated device according to claim 11 wherein the self test state machine includes a multiple input signature (MISR) compressor to generate at least one compressed value in response to corresponding sequences of the output values, and a comparator operable to compare the at least one compressed value with the expected test values.

14. The integrated device according to claim 11 wherein the built-in self testing circuit further includes a ROM (Read Only Memory) BIST (Built-In Self Testing) circuit operable to execute a memory test on the memory, the structured test being executed in response to a result of the memory test.

15. The integrated device according to claim 11 wherein the built-in self testing circuit further includes a current monitor operable to execute a quiescent test by comparing at least one quiescent current of the integrated device with at least one threshold value stored in the memory.

* * * * *